United States Patent [19]

Nakasuji et al.

[11] Patent Number: 5,007,577
[45] Date of Patent: Apr. 16, 1991

[54] MULTIPLE-CORE COMPLEX MATERIAL AND METHOD OF MANUFACTURING THE SAME

[75] Inventors: Kazuyuki Nakasuji; Chihiro Hayashi, both of Osaka; Yoshiyuki Suzushima, Suita, all of Japan

[73] Assignees: Sumitomo Metal Industries Ltd.; Sumitomo Special Metals Co., Ltd., both of Osaka, Japan

[21] Appl. No.: 439,534

[22] Filed: Nov. 21, 1989

[30] Foreign Application Priority Data

Nov. 22, 1988 [JP] Japan .................. 63-295264

[51] Int. Cl.⁵ .................................. B23K 20/04
[52] U.S. Cl. .................................. 228/265; 228/235
[58] Field of Search ............ 228/126, 127, 133, 173.5, 228/265, 182, 190, 193, 208, 235

[56] References Cited

U.S. PATENT DOCUMENTS

| 246,407 | 8/1881 | McTighe | 228/117 |
|---|---|---|---|
| 3,204,326 | 9/1965 | Granitsas | 228/235 |
| 3,355,796 | 12/1967 | Frieling, Jr. | 228/117 |
| 3,463,620 | 8/1969 | Winter | 228/265 |
| 3,991,928 | 11/1976 | Friedrich et al. | 228/190 |
| 4,209,122 | 6/1980 | Hunt | 228/173.5 |
| 4,598,859 | 7/1986 | Cajthaml, Jr. et al. | 228/235 |
| 4,732,314 | 3/1988 | Sakamoto | 228/190 |

FOREIGN PATENT DOCUMENTS

| 88820 | 3/1937 | Sweden | 228/190 |
|---|---|---|---|
| 1443035 | 7/1976 | United Kingdom | 228/190 |

*Primary Examiner*—Sam Heinrich
*Attorney, Agent, or Firm*—Burns, Doane, Swecker & Mathis

[57] ABSTRACT

Heat-radiating substrate material characterized by a matrix of Ni-Fe alloy or Ni-Co-Fe alloy where a plurality of Cu elements penetrating cross-sectionally and the metals being mutually bonded by diffusion bonding to form multiple-core material.

A method of manufacturing multiple-core complex material including process steps of manufacturing clad complex core member with a circular cross section, followed by formation of multiple-core complex billets composed of a plurality of complex core members filled in a metallic tube within the extent that the ratio of the inner diameter (D) of the metallic tube to the outer diameter (d) of the core member D/d is not less than 12, and then, after heating the complex billets, the core members are diffused and bonded together by a hot working at a reduction of area being not less than 20%.

14 Claims, 12 Drawing Sheets

MULTIPLE-CORE COMPLEX MATERIAL AND METHOD OF MANUFACTURING THE SAME

BACKGROUND OF THE INVENTION

1. Field of the Invention

The present invention relates to a method of manufacturing multiple-core complex material and multiple-core clad complex material used for composing heat-radiating substrates for use with semiconductor integrated circuits.

2. Description of Related Art

Generally, for composing heat-radiating substrate material for semiconductor elements and semiconductor integrated circuits there have been required to have those advantages such as heat-radiating characteristic (thermal conductivity), satisfactory thermal expansion coefficient approximating those of the package composing material of semiconductor elements and circuit substrates, light-weight construction, satisfactory mechanical workability, and inexpensiveness. To satisfy these requirements, either the assembly or the complex material composed of copper (Cu), molybdenum (Mo), tungsten (W), Ni-Fe alloy, Ni-Co-Fe alloy, aluminum (Al), and silicon (Si) has been known.

Nevertheless, as a whole, the assembled material for composing heat-radiating substrate is not widely used because of such disadvantages as (trouble to assemble) several kinds of materials for its users, unlikeliness to lower the thermal resistance of the assembled material below a certain level as a result of assembling several kinds of materials in composition, and unlikeliness to enlarge their junction area because each material has its own thermal expansion coefficient different from each other, thus causing the substantial restriction to incur on the design, production, and thermal resistivity of its package.

Reflecting those disadvantages mentioned above, heat-radiating substrates are mostly composed of the complex material today. The complex material is manufactured by applying either the sheet-cladding process or the powder-sintering process.

The sheet-cladding process heaps up such material with substantial thermal conductivity and thermal expansion coefficiency as copper and the like and such sheet material with less thermal conductivity and thermal expansion coefficient as Ni-Fe alloy and Ni-Co-Fe alloy so as to form not less than double layers by bonding them together with pressure. Though the sheet-cladding process permits mass production of the complex sheet material on the industrial basis to yield large-area substrates inexpensively, the complex material becomes anisotropic, on the contrary, and difficult to be bonded together so that this problem should be taken into consideration. The problem is that its thermal conductivity tends to be higher in the direction parallel the surface but lower in the direction of the substrate thickness, whereas in the bonded multiple-layer sheet material, thermal expansion coefficient is smaller in the direction along the surface but larger in the direction of the substrate thickness. Accordingly, this process is unfavorable since semiconductor (devices being equipped on the multiple-layer sheet material is cracked) or peeled to result in leakage which possibly causes the semiconductor devices themseleves to be malfunctional or broken. On the other hand, there are two kinds of the powder-sintering process including the blended metallic powder-sintering process and the infiltrating process. The blended metallic powder sintering process is to blend metal powder (like the combination of copper with tungsten) simultaneously with the sintering process, solidifying the blended metallic powder into the complex sheet material. If the blend ratio of the copper powder were identical to that of the tungsten powder, thermal expansion coefficient of the complex sheet material grows not less than that being yielded with the infiltrating process which will be described later, and thus, blending of copper and tungsten at the equal blend ratio is not desirable. The infiltrating impregnating process is to press and sinter pulverized tungsten powder to form a porous body with uniformly and randomly distributed fine holes and to infiltrate molten copper into the porous body before eventually forming the complex material by integrating the porous body with copper. The molten-copper infiltrating process is disclosed in the Japanese Patent Application Laid-Open No. 59-141247. According to this art, appropriate thermal expansion coefficient is yielded by causing tungsten to constrain the thermal expansion of copper. Futhermore, since the copper-tungsten complex material available for heat-radiating substrate has low rate of thermal expansion and high thermal conductivity, as a whole, reflecting these desirable characteristic properties, the heat-radiating substrate material is manufactured by applying the molten-copper infiltrating process today. However, application of this process has disadvantages that such material (costs expensive) and that it has specific gravity and hardness to make the machining work difficult, and that is has limited uses. The Japanese Patent Application Laid-Open No. 62-294147 proposes the art of manufacturing alloy material which substantially coincides the thermal expansion coefficient of the heat-radiating substrate material with that of semiconductor elements by properly adjusting the blend ratio of tungsten or molybdenum, copper and nickel. However, those materials with high melting points such as molybdenum and tungsten are so expensive and so difficult to be processed that utilization of the heat-radiating substrate material for the semiconductor integrated circuits mainly composed of those materials with high melting points results in such disadvantages as it being expensive and difficult to be processed.

To avoid those disadvantages mentioned above and improve thermal conductivity, Japanese Patent Application Laid-Open No. 61-208899 proposes materials for composing heat-radiating substrates. Likewise, Japanese Patent Application Laid-Open No. 63-14829 proposes a method of manufacturing heat-radiating substrates. These prior arts propose the material for composing heat-radiating substrates made of a plurality of metal-wound wire material with low thermal expansion coefficient and the method of manufacturing it, respectively. The heat-radiating substrate material proposed by those inventions cited above decreases the amount of molybdenum to be consumed. Although its cost can be reduced to a certain extent, its cost economy cannot yet fully be achieved. Furthermore, since there is substantial difference of the thermal expansion coefficient in the direction of its axial line and in the orthogonal direction against the axial line, reliability of the product is still insufficient.

Recently, the method of restraining heat evolution and cooling a variety of substrates used for ICs, LSIs, and VLSIs, is a critical issue among the concerned.

Manufacturers have employed such a method of cooling semiconductor-element substrates as causing metallic material to be bonded with a variety of substrates for radiating heat from them. However, utilization of the conventional material for radiating heat from the substrates mentioned above results in problems in that it (costs are expensive) and in that the material cannot easily be processed. On the other hand, application of inexpensive material is inappropriate owing to the presence of anistropy in the thermal expansion coefficient and thermal conductivity, owing to its large specific gravity, and poor adjustment with elements and ceramics when circuit assembly is underway.

SUMMARY OF THE INVENTION

The invention has been achieved to fully solve those technical problems mentioned above.

A first object of the invention is to provide heat-radiating substrate material which is inexpensive, with good machinability, small thermal expansion coefficient, excellent thermal conductivity and lower specific gravity by using Ni-Fe alloy or Ni-Co-Fe alloy being a matrix with a plurality of Cu elements penetrating the matrix cross-sectionally and the metals being mutually bonded by diffusion bonding so as to produce multiple-core complex material.

A second object of the invention is to provide a novel method of effectively manufacturing multiple-core complex material featuring satisfactory adjustment with circuit elements and ceramics by executing the sequential steps of: manufacturing multiple-layer clad complex core members each with round section; forming complex billets composed of a plurality of multiple-layer clad complex core members densely being loaded inside of a metallic tube within an extent in which (not less than 12 of the ratio D/d) between the outer diameter "d" of the multiple-layer clad complex core member and the inner diameter "D" of the metallic tube; heating the formed complex billets; and applying the final hot-working process so that a minimum of 20% of the area reduction can be performed.

The above and further objects and features of the invention will more fully be apparent from the following detailed description with accompanying drawings.

DESCRIPTION OF THE PREFERRED EMBODIMENTS

Referring now more particularly to the embodiments shown in the accompanying drawings, the multiple-core complex material and the method of manufacturing the same related to the invention is described below.

Figure 1:
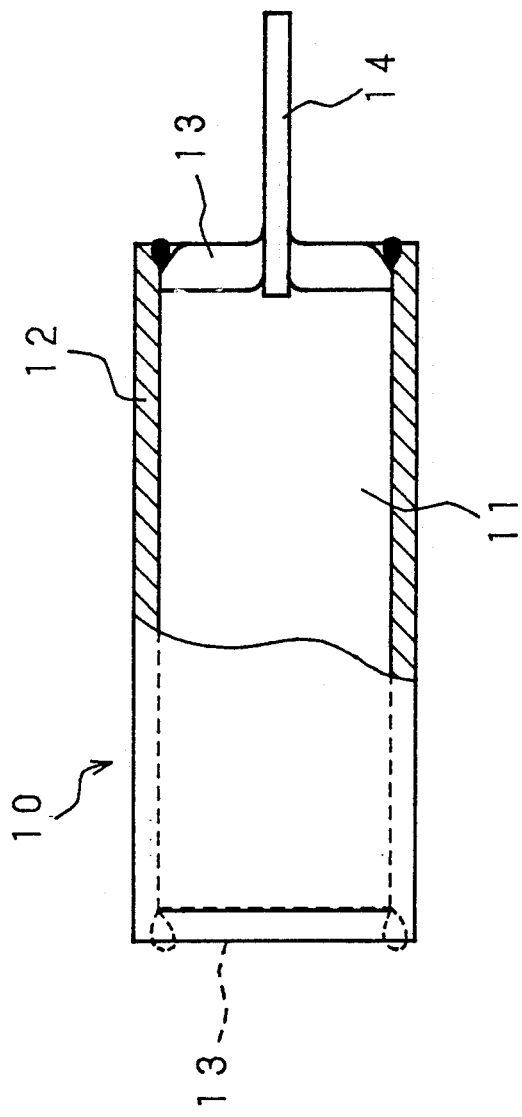
FIG. 1 illustrates a sectional view of a partially fragmentary portion of the double-layer clad billet manufactured in accordance with the method embodied by the invention.
Figure 2:
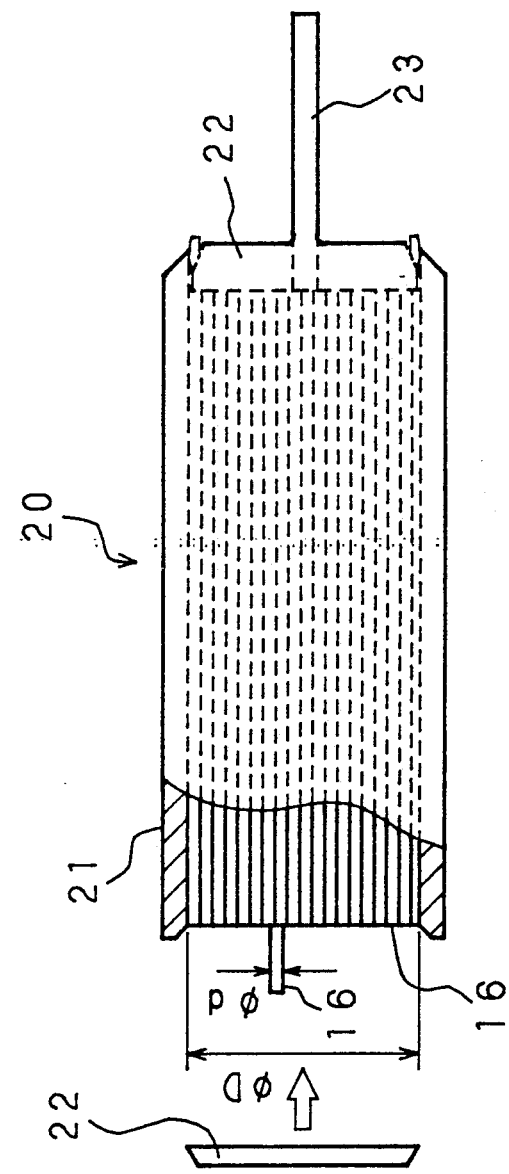
FIG. 2 illustrates a sectional view of the partially fragmentary portion of the multiple-core complex billet manufactured in accordance with the method embodied by the invention.

In summary, multiple layer clad complex core member 16 with round section is manufactured from multiple layer clad material 10 comprising internal layer material 11 and cylindrical external layer material 12, as shown in FIG. 1. Concretely, as shown in FIG. 2, complex billet 20 of multiple core structure is manufactured by densely loading several through several-thousand pieces of multiple clad complex core member 16 in a metallic casing 21 within an extent in which the ratio D/d between the outer diameter "d" of the multiple-layer clad complex core member and the inner diameter "D" of the metallic casing 21 is not less than 12. Next, the complex billet 20 is heated up to a predetemined temperature (to perform hot-working process) at an area reduction of a minimum of 20% which can allow the multiple-layer clad complex core member to be shaped (into a substantially hexagon al shape. Finally, the hexagonal complex core member 16 is diffused and bonded together so that the multiple-core complex member can be manufactured.

Next, double-layer clad material representing the multiple-layer clad material 10 embodied by the invention is described below.

Figure 4:
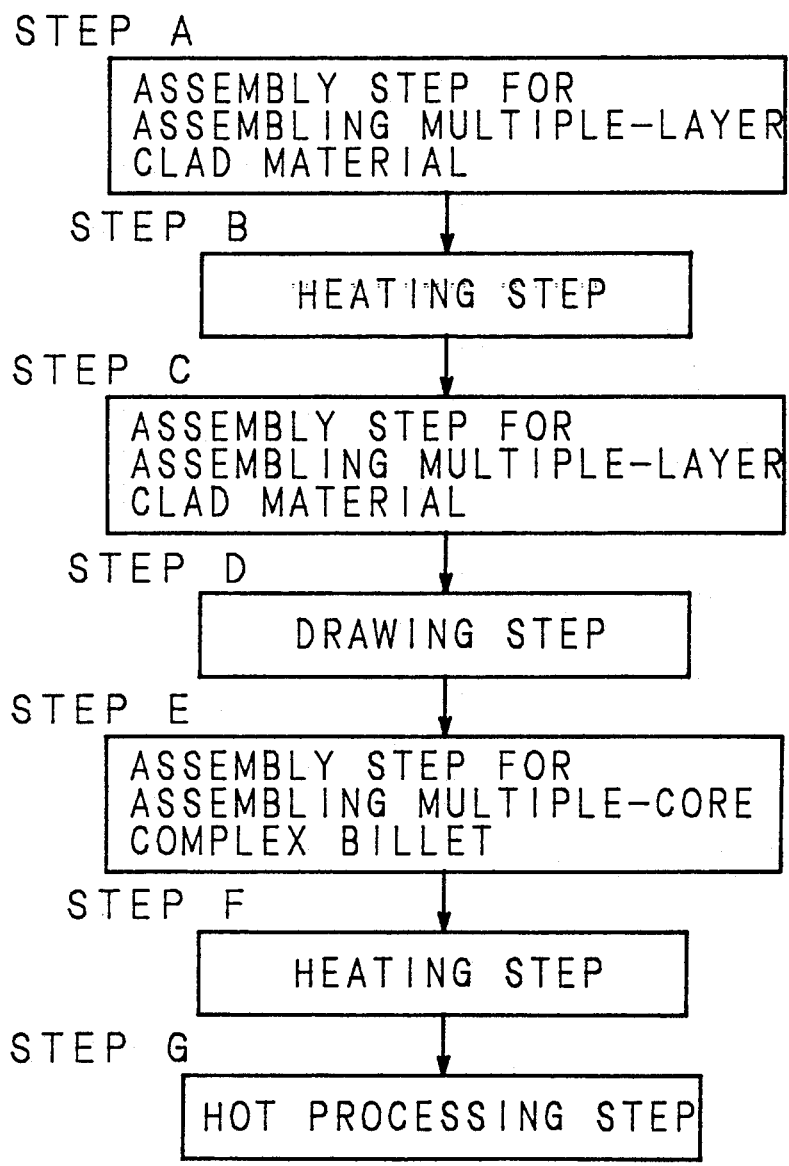
FIG. 4 is a block diagram designating the manufacturing processes embodied by the invention.

FIG. 4 is a block diagram designating the main manufacturing processes in accordance with the method embodied by the invention. The double-layer clad material is manufactured by those sequential steps described below.

Step A: When the initial step A is activated, the system assembles the double-layer clad material 10 composed of the internal-layer material 11 consisting of metallic rod and the external-layer material 12 consisting of a metallic tube and the like whose metallic substance is different from that of the internal-layer material 11.

Step B: When step B is entered, the system heats the assembled double-layer clad material 10 to a predetermined temperature.

Step C: When step C is entered, the system rolls the heated double-layer clad material by means of the rotary mill equipped with a minimum of three cone-type rolls.

Step D: When step D is entered, the system draws the double-layer rolled clad material 15 by means of dies.

Step E: When step E is entered, the system assembles the multiple-core complex billets 20 by densely filling several through several-thousand pieces of multiple-layer clad complex core member 16 (having the outer diameter "d" after being reduced by the rolling process) in the metallic tube 21 within an extent in which the ratio D/d between the outer diameter "d" of the complex core member 16 and the inner diameter "D" of the metallic tube 21 is not less than 12.

Step F: When step F is entered, the system heats the assembled complex billet 20 to a predetermined temperature.

Step G: When the final step G is entered, the system elongates the heated complex billet (20 by a hot)-working process at an area reduction of a minimum of 20%.

Now, those steps mentioned above are individually described below in detail. Step A for assembling the double-layer clad material 10 is described below. FIG. 1 is the sectional view including the partially sectional view of the double-layer clad material 10 under the production process.

First, the internal-layer material 11 composed of such metal as copper with extremely high thermal conductivity and the cylindrical external-layer material 12 composed of such metal as Ni-Fe alloy or Ni-Co-Fe alloy with low thermal expansion coefficient are prepared. After degreasing and cleaning those metallic materials, the internal-layer material 11 is inserted into the external-layer material 12. Then, both ends of the combined materials are sealed with covers 13 and 13 made of the same alloy used for the external-layer material 12 by means of welding. One of these covers 13 is preliminarily provided with an air-extraction tube 14. Using this air-extraction tube 14, air is extracted from the interior of the external-layer material 12 until the evacuation degree is under $1 \times 10^{-1}$ Torr. Next, the double-layer clad material 10 is manufactured in presence of the evacuation condition mentioned above by sealing part of the air-extraction tube 14. The evacuation degree is set to a maximum of $1 \times 10^{-1}$ Torr on the following ground. If it exceeds this evacuation degree, oxide may be generated between the surfaces of the internal layer material 11 and the external-layer material 12 when a hot rotary rolling process is underway. This will result in the extremely lowered bonding strength. It may be also possible for the embodiment to manufacture multiple-layer clad material having not less than 3 layers by inserting interim material made of another kind of metal between the internal material 11 and external layer material 12.

Next, the heating step B is described below. The double-layer clad material 10 manufactured through the assembly step A is then heated to a predetermined temperature lower than the melting points of the internal layer material 11 and the external layer material 12 (and the interim material if it were present).

Figure 5:
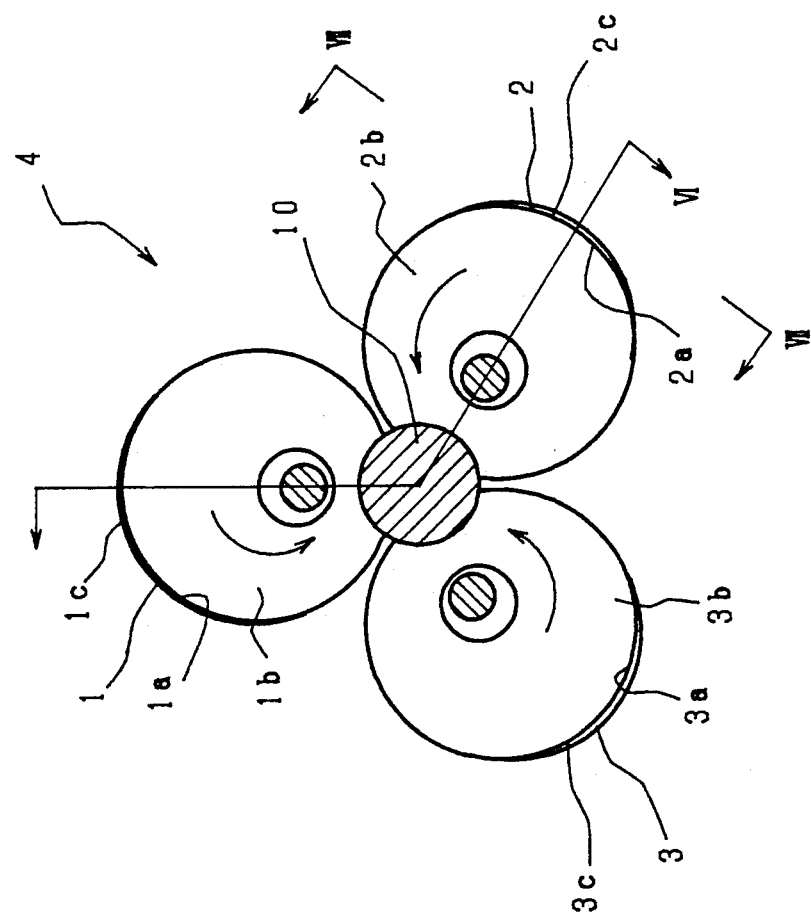
FIG. 5 illustrates a front sectional view of rolls of a rotary mill and the multiple-layer complex core material.
Figure 6:
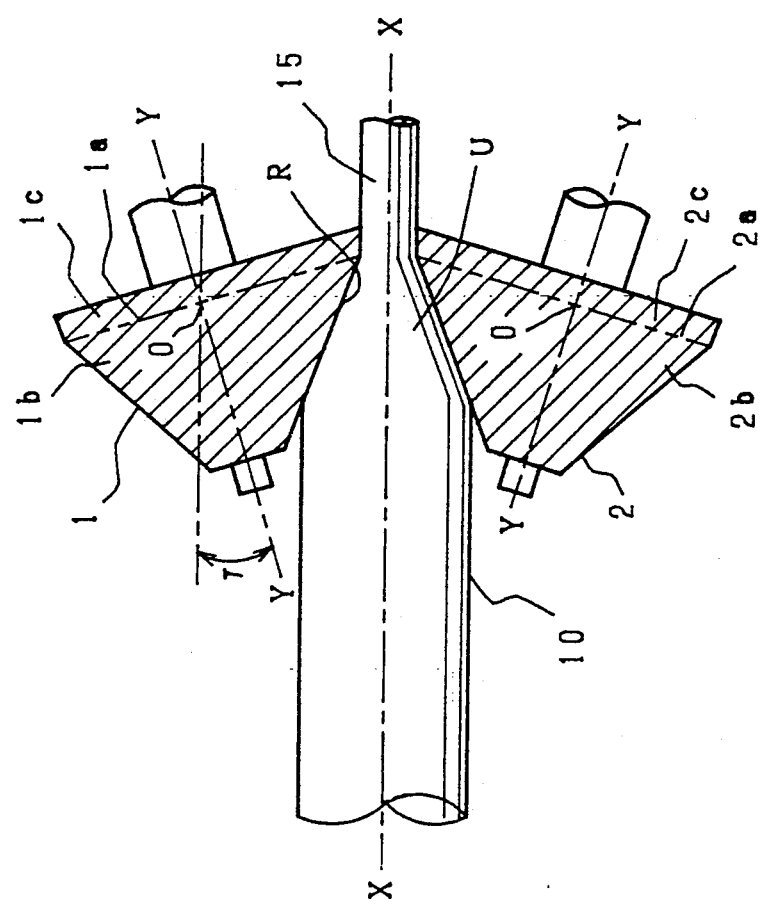
FIG. 6 illustrates a sectional side elevation view of the rolls of the rotary mill and the multiple-layer complex core material shown in FIG. 5 across line VI—VI.
Figure 7:
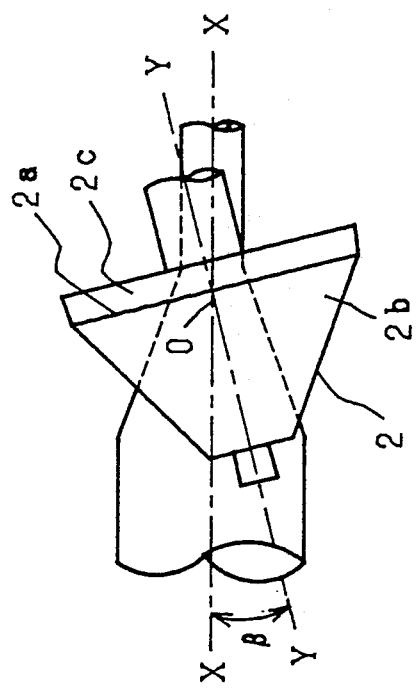
FIG. 7 illustrates a side elevation view of the rolls of the rotary mill shown in FIG. 5 seen from line VII—VII.

Next, the elongation step C using the rotary mill is described below. A hot rolling process is executed by applying the rotary mill having not less than three cone-type rolls as shown in FIGS. 5 through 7. This is because, if the rotary mill having two cone-type rolls were employed, what is called, "Mannesmann" destruction phenomenon will be generated to induce occurrence of cracking in the center of the rolled object. It is desired that a rotary mill which has a cross angle and a feed angle shall be employed.

FIG. 5 illustrates the front view of the rotary mill 4 (used for embodying the invention) when the rolling operation is underway. FIG. 6 is the sectional view of the rotary mill 4 across the line VI through VI shown in FIG. 5. FIG. 7 is the side elevation view seen in the direction of the line VII through VII. The rotary mill 4 is equipped with three cone-type rolls 1 through 3 to be faced in the periphery of the pass line. These rolls 1 through 3 have gorge portions 1a, 2a, and 3a respectively at the position close to the outlet of the double-layer clad material 10. The inlet of the double-layer clad material 10 is gradually reduced in the diameter in the direction of the end of the roll axis beyond the gorge portions 1a through 3a. The outlet side of the double-layer clad material is provided with the inlet surfaces 1b through 3b and the outlet surfaces 1c through 3c, which are expanded and form a frustum of circular cone, respectively. The distance between the outlet surfaces 1c through 3c and the pass line coincide with the distance between the gorge portions 1a through 3a and the pass line X through X. The inlet surfaces 1b through 3b of the cone-type rolls 1 through 3 are positioned on the up stream side in the direction of the movement of the double-layer clad material 10, respectively. The intersection points O (hereinafter called the roll-setting axis) intersecting the axial line Y—Y and the plane including the gorge portions 1a through 3a, are arranged respectively to the positions in the periphery of the pass-line X—X at substantially equal intervals on the identical planes orthogonally intersecting the pass line X—X of the double-layer clad material 10. As shown in FIGS. 5 and 6, in connection with the pass line X—X of the double-layer clad material 10, the respective axial lines Y—Y of rolls 1 through 3 are inclined around the roll-setting axis O, so that the axial ends at the inlet of the clad material 10 can approach and incline the pass line X—X by cross angle $\gamma$. Furthermore, as shown in FIGS. 6 and 7, the axial ends at the inlet of respective rolls 1 through 3 incline themselves by feed angle $\beta$ in the direction identical to the circumferential direction of the double-layer clad material 10. The cross angle $\gamma$ and the feed angle $\beta$ are determined so that $0° < \gamma < 15°$, $3° < \beta < 20°$, and $5° < \gamma + \beta < 30°$ can be satisfied respectively.

These rolls 1 through 3 are connected respectively to their driving sources (not shown), which are jointly rotated in the identical direction as shown in FIG. 5 with the arrows. The rolled double-layer clad material 10 enveloped by these rolls 1 through 3 is transferred in the direction of the axial length while rotating itself around its own axial line. In other words, the clad material 10 is rolled in a spiral movement.

While the double-layer clad material 10 spirally moves between rolls 1 through 3, as shown in FIG. 6, the outer diameter is reduced by a roll-bitten portion R, where the double-layer clad material 10 is exposed to high pressure in order that the outer diameter of the double-layer clad material 10 can be reduced by a maximum area reduction of 80 through 90% for example. As a result, its pressed portion U is transformed into a frustum of the circular cone before eventually being processed into a double layer rolled clad material 15 with a circular section by means of the gorge portions 1a through 3a and the outlet surfaces 1c through 3c.

In order to produce the double-layer rolled clad material 15 by rolling and elongating the double-layer clad material 10, the embodiment of the invention employs the rotary mill equipped with a minimum of three cone-type rolls. The reason is described below.

Conventionally, in addition to the rotary mill mentioned above, there are such hot working processes as the forging, rolling with grooved rolls, and hydrostatic extrusion process. However, there exist problems in that each of these three processes is inferior to the rotary rolling process in the bond strength at the diffusion interface and in the uniformity of the external layer material, and in addition, each of these three processes causes unbonded portions to remain between the internal and external materials if there were excessive difference in the resistivity against deformation between both materials. When processing the double-layer rolled clad material 15, unless the bond effect is perfectly achieved, unbonded portion will still remain after completing the manufacture of multiple-core complex material 24. If the multiple-core complex material 24 internally holding the unbonded portions were used for composing a heat-radiating substrate, due to the presence of unbonded portion, neither ICs, nor LSIs, nor VLSIs can properly maintain its airtightness.

In the light of those grave reasons mentioned above, the embodiment of the invention solely employs the rotary mill which can perfectly bond the internal material and external material of the double-layer rolled clad material 15 and provide both outstanding strength in the bonded interface and uniformity of the external layer material. It is desired that the rolling and elongation process executed by the rotary mill may securely generate a minimum of 50% of the area reduction. And the execution of rolling and elongation process with the above area reduction will more securely realize satisfactory bond effect and strength.

Next, the drawing step D is described below. Generally, if the rolled material had a small diameter when operating the rotary mill equipped with 3 rolls, the diameter of these rolls should be small owing to geometrical restriction. This necessarily leads to a lower rolling speed. Since the temperature of the double-layer clad material 10 lowers, it is (practically possible for the rotary mill to hot roll) the double-layer clad material 10 until the diameter reaches about 10 mm by means of the rotary rolling. However, if the double-layer clad material 10 should be rolled until the diameter is reduced below 10 mm, practically, hot rolling cannot be implemented. (To compensate for this, if a maximum of 10 mm of the diameter were required, a drawing process is to further be provided.)

There are those processes for executing the wire elongation including a die-applied wire drawing process, a roll-die applied drawing process, or a diameter reducing processing by a grooved roll mill and the like, etc. However, in order to prevent uneven thickness of the outer layer material, it is recommended to introduce the die-applied wire drawing process which effectively prevents occurrence of uneven thickness of the external-layer material 12 of the double-layer rolled clad material 15 as much as possible.

Figure 8:
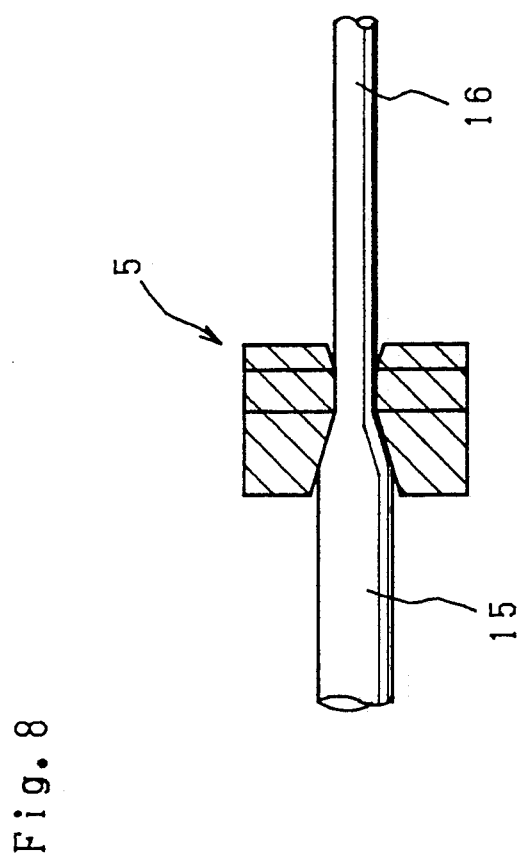
FIG. 8 illustrates a sectional view of main part of a die which draws the multiple-layer complex core material.

FIG. 8 is the schematic chart designating the wire-drawing process using die 5. After completing the hot rolling process, scale is removed from the surface of the double-layer rolled clad material 15. Then, after receiving lubricant coating, the double-layer clad material 15 is drawn by wire-drawing process before eventually being converted into the double-layer complex core member 16. The embodiment of the invention specifies that not less than 12 of the ratio D/d is essential between diameter "d" of the double-layer clad complex core member 16 and the inner diameter "D" of the multiple-core complex billet metallic tube 21. The reason is described below.

Generally, when manufacturing multiple-core complex material, multiple-core complex billet is assembled by applying core material with hexagonal section. This is because the rate of loading core material into multiple-core complex material can effectively be increased and the core material with hexagonal section can easily be diffused and bonded.

On the other hand, there exists a problem that a number of working steps are needed for assembling the multiple-core complex billet and the cost rises by applying core material with hexagonal section. To solve this problem, inventors of the invention studied on the feasibility of manufacturing high-quality multiple-core complex material by effectively assembling complex billets 20 with round-sectional core material. Inventors eventually discovered that fully diffused and bonded multiple-core complex material 24 could be manufactured, and yet, core materials could be bonded together in the hexagonal shape by providing not less than 12 of the ratio D/d between the outer diameter "d" of the multiple layer clad complex core member and the inner diameter "D" of the multiple core complex billet metallic tube 21 and also by executing hot-working process to perform area reduction by not less than 20%.

On the other hand, if not less than 12 of the ratio D/d were provided between the outer diameter "d" of the multiple-layer clad complex core member and the inner diameter "D" of the multiple-core complex billet metallic tube 21, an unbonded portion can partially be produced in the section of the multiple core complex material. This results in poor quality.

Next, step E for assembling the multiple-core complex billet 20 is described below. FIG. 2 illustrates the multiple-core complex billet 20 under its production process including a partially sectional view thereof.

First, there are prepared several through several-thousand pieces of the double-layer clad complex core member 16 being produced from those processes mentioned above and a cylindrical metallic tube 21 made of the same or almost the same material as that of the external layer material 12 of the double-layer clad complex core member 16. Next, all those prepared materials are degreased and washed with organic solvent and the like. Then, as shown in FIG. 2, an operator inserts several through several thousand pieces of the double-layer clad complex core member 16 into the metallic tube 21 so that its loading rate reaches a minimum of 80%. Next, both ends of the metallic tube 21 are sealed with covers 22 and 22 by means of welding and the like. Then, using the air extraction tube 23 mounted to one of the covers 22, air is fully extracted from the interior of the metallic tube 21 until reaching under $1 \times 10^{-1}$ Torr of the evacuation degree. Next, part of the air extraction tube 23 is fully sealed to prevent entry of atmospheric air before eventually obtaining the multiple-core complex billet 20. Determining that the inner diameter of the metallic tube 21 is "D", the outer diameter of the inserted double-layer clad complex core member 16 is "d", and the number of the double-layer clad complex core member 16 is "N", the rate of loading the double-layer clad complex core member for obtaining the multiple-core complex billet 20 is calculated by applying the expression shown below.

$$\frac{\pi/4 \cdot d^2 \cdot N}{\pi/4 \cdot D^2} \times 100(\%)$$

The embodiment of the invention specifies the evacuation degree inside of the metallic tube 21 to be a maximum of $1 \times 10^{-1}$ Torr. This is because, if the evacuation degree exceeds $1 \times 10^{-1}$ Torr, oxide is generated over the surface of the inserted double-core clad complex core member during the heating process which is to be executed later on. This in turn results in the incomplete bond effect. To prevent this, the evacuation degree is specified to be a maximum of $1 \times 10^{-1}$ Torr in the embodiment.

Next, step F for heating the multiple core complex billet 20 is described below. The multiple-core complex billet 20 is heated to a predetermined temperature lower than the melting points of the internal layer material 11 and the external layer material 12 of the core material, the interim material (if it is present), metallic tube 21, and the compound between these metallic components.

Next, step G for executing the hot-working process against the multiple-core complex billet 20 is described below. The multiple-core complex billet 20 is elongated in (hot to diffuse) and bond the double-layer clad complex core member 16 mutually.

The embodiment of the invention executes the hot elongation step in order to eliminate clearance inside of the multiple-core complex billet 20, and at the same time, each piece of the double-layer clad complex core member 16 is transformed into the hexagonal shape and brought into perfect contact with each other. In addition, the hot elongation step diffuses mutually the external layer material 12 of the double-layer clad complex core member and then bonds them together to intensify their bond strength. In order to perform identical transformation inside of the section, the embodiment introduces either process of the hot hydrostatic extrusion, or hot extrusion, or hot rotary rolling process, which represent axially symmetrical process respectively. When processing the multiple-core complex billet 20, each external-layer material 12 which is basically composed of the identical kind of metal is diffused and bonded together, and thus, any of those three processes mentioned above may be employed. Since the embodiment of the invention specifies a minimum of 80% of the rate of loading the double-layer clad complex core member 16, the clearance rate (empty rate) is in a range of a maximum of 20%. (In presence) of not less than 20% of the area reduction, core materials can properly be diffused and bonded together by applying the hot elongation step.

Figure 9:
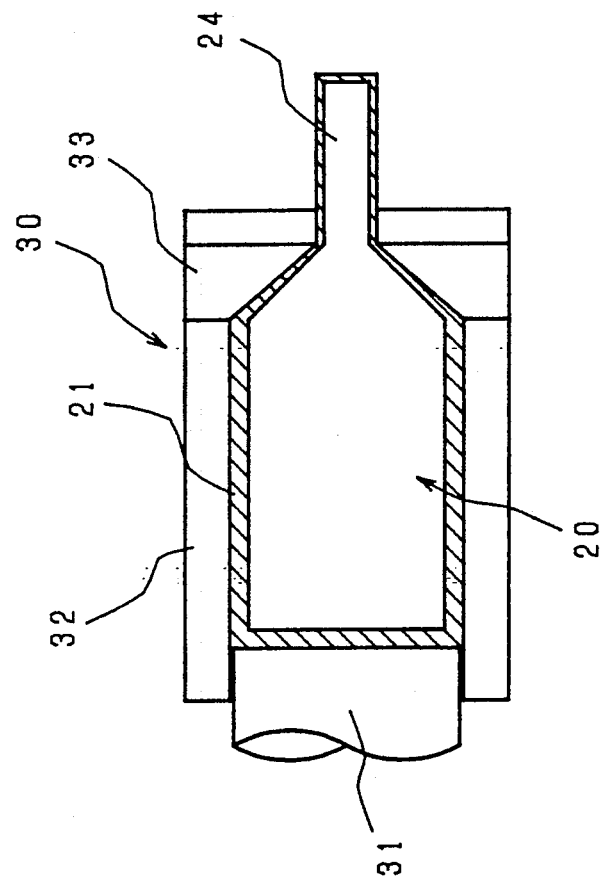
FIG. 9 illustrates a sectional side elevation view designating the state of a hot extrusion process applied to the multiple-core complex billet embodied by the invention.
Figure 10:
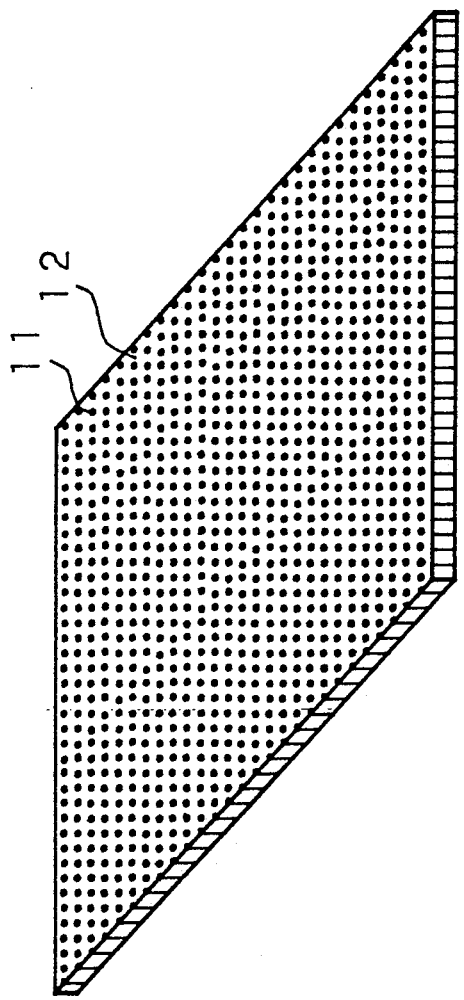
FIG. 10 illustrates a schematic view of a sheet-type heat-radiating substrate made from the multiple-core complex material of the invention.
Figure 11:
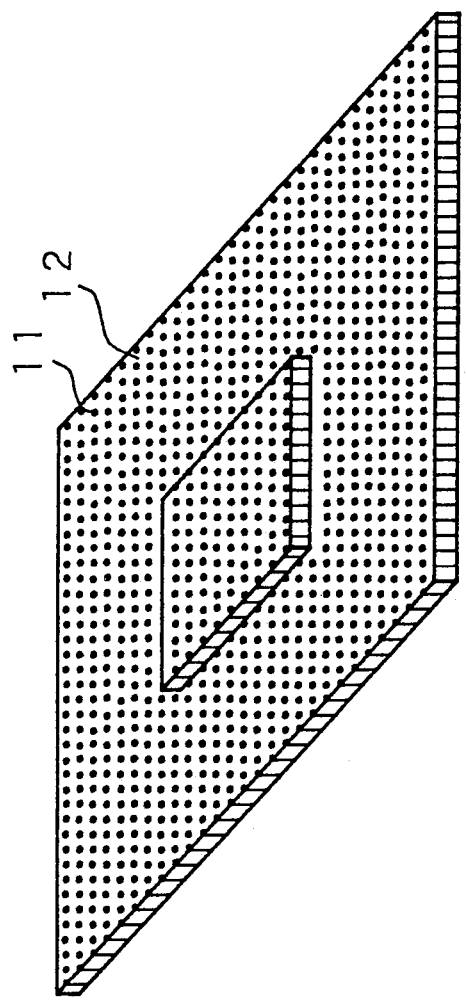
FIG. 11 illustrates a schematic view of a sheet-type heat-radiating substrate with an island made from the multiple-core complex material of the invention.
Figure 12A:
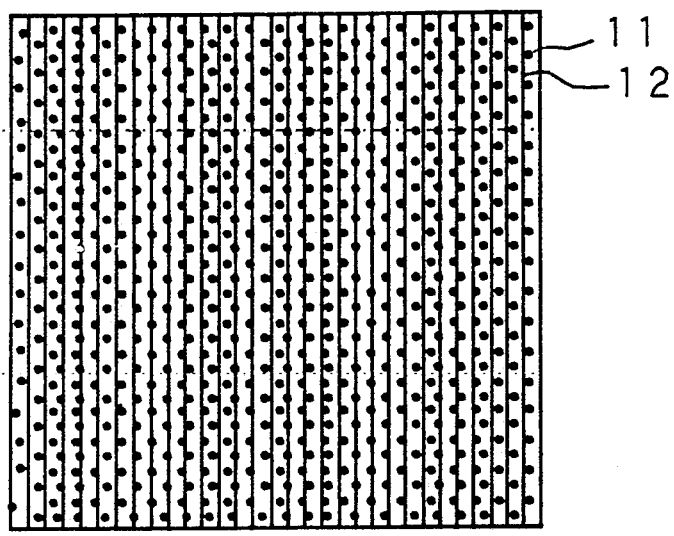
FIG. 12 illustrates a schematic view of a sheet-type heat-radiating substrate with an island and fins made from the multiple-core complex material of the invention.
Figure 12B:
Figure 12C:
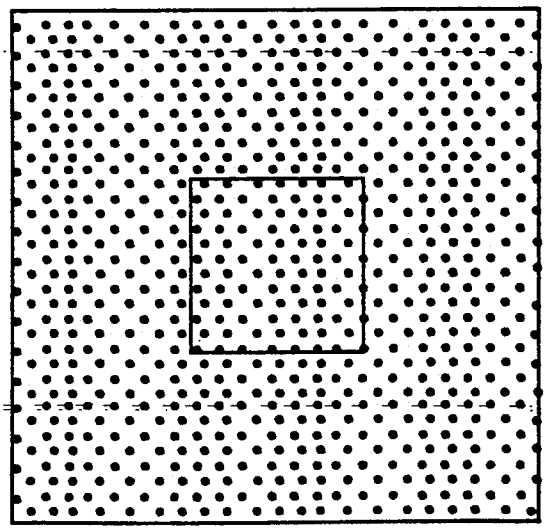

FIG. 9 illustrates the hot extrusion process available for the hot elongation step. As shown in FIG. 9, the heated multiple-core complex billet 20 is initially coated with lubricant and then inserted into a container 32 of a hot extrusion apparatus 30. The inserted complex billet 20 is then pressurized by an extrusion punch 31 and then extruded by a die 33 which reduces the diameter of the complex billet 20. The extruded complex billet 20 is then converted into the multiple-core complex material 24. Finally, the complete multiple-core complex material 24 is perpendicularly severed in the axial direction, thus becoming thin sheets, or convex pieces or the like to be used as heat-radiating substrates. FIGS. 10, 11 and 12 illustrate examples of its workpieces.

In addition to those hot elongation processes mentioned above, a rolling with two grooved rolls and a forging process are also applicable. Nevertheless, either of these two processes can unevenly transform the processed material, and thus, the double-layer clad complex core member 16 (will partially transformed) into a variety of configurations. To merely diffuse and bond each of the double-layer clad complex core member 16, those two processes cited above are effective. However, both of these are still inferior to the hot extrusion process in the formation of uniform shape, and as a result, these two rod elongation processes including the rolling with two grooved rolls and forging process are not recommended for the elongation process needed for securely producing the objective uniform-quality multiple-core complex material 24. However, rolling process with three grooved rolls or rolling with four grooved rolls are acceptable for use.

Next, numerical examples needed for the multiple-core complex material 24 of the invention and for producing the multiple-core complex material 24 of the invention are concretely introduced below.

Oxygen-free copper rod (99.99% purity) with 38 ($-0.1$ through $-0.3$) mm of diameter and 300 mm of length is employed for composing the internal layer material 11. First, inventors degreases and washes the circumferential surface of this OFC rod with organic solvent. Then, inventors inserts the cleaned OFC rod into the external-layer material 12 which is through with degreasing and washing processes and composed of 36% Ni-Fe alloy with 60 mm of the outer diameter, 38 (0 through 0.2) mm of the inner diameter, and 320 mm of the length.

Next, inventors seal both ends of the external layer material 12 with covers 13 composed of 36% Ni-Fe alloy by means of welding. Then, inventors extracts air from the interior of the metallic tube until reaching $2 \times 10^{-1}$ Torr of the evacuation degree to produce the double-layer clad material 10. Table 1 designates constitution of the components of 36% Ni-Fe alloy and oxygen-free-copper rod used for composing the external layer material 12 and the internal layer material 11.

Next, after heating the completed double-layer clad material 10 to 950° C., using an intersection-type rotary mill equipped with three cone-typed rolls, inventors carry out a rotary rolling process based on the rolling conditions shown below.

Conditions of rotary mill rolling:
 Cross angle ($\gamma$): 3°
 Feed angle ($\beta$): 13°
 Diameter of roll gorge portion: 117 mm
 Roll material: SCM440
 Number of rotation of roll: 80 rpm
 Area reduction: 87.8% (60 mm$\phi$→21 mm$\phi$)

After execution of the rotary rolling process based on the above condition, inventors produce the double-layer rolled clad material 15. Inventors then wash the completed double-layer rolled material 15 with acidic solution to remove superficial scale. Next, based on 15% of the mean area reduction per die, inventors draw the double-layer rolled clad material 15 in cold so that the processed clad material 15 could be provided with 1.5 mm, 2.0 mm, 3.0 mm, 4.0 mm, and 5.0 mm of diameter respectively. Inventors then severs these double-layer clad materials 15 by 175 mm of length for each, and then degreases and washes them with organic solvent. Inventors, then, inserts several through several thousand pieces of the cleaned clad material 15 into metallic tube 21 composed of 36% Ni-Fe alloy which is preliminarily degreased and washed with organic solvent and had 67 mm of the outer diameter, 55 mm of the inner diameter, and 185 mm of length each. Finally, inventors extracts air from the metallic tube until $2\times 10^{-4}$ Torr of the evacuation degree is reached to complete the production of the multiple-core complex billets 20.

Next, inventors applies heat to the completed multiple-core complex billets 20 up to 950° C., and then coats them with glass lubricant composed of 57% $SiO_2$, 19% $B_2O_3$, 22% $Na_2O_3$, and 2% CaO+MgO. Finally, inventors carries out the hot extrusion process so that each of the completed multiple-core complex billets 20 could be provided with 30 mm of the outer diameter. Finally, inventors executes a variety of evaluation test against the thermally extruded multiple layer complex core material 24 to check the presence of potential defect by applying penetrant test, measure the shearing strength at the bond of the multiple-core complex material 24 by applying the shearing test, and evaluate the thermal expansion coefficient, thermal conductivity and the like. The results of those evaluation tests mentioned above are introduced in Tables 2 and 3.

According to the results of analysis shown in Tables 2 and 3, it is confirmed that, if there is not more than 12 of the ratio D/d between the diameter "d" of the double-layer clad complex core member 16 and the inner diameter "D" of the multiple complex billet metallic tube, as a result, the bonded effect remains defective. Conversely, if there is not less than 12 of the ratio D/d, the bonded effect remains satisfactory. When the double-layer clad complex member is heated at 100° C., its thermal expansion coefficient remains at $5.2\times 10^{-6}$/°C. When the double-layer clad complex core material is heated at 25° C., its thermal conductivity remains at 120 kcal/m.h.°C., proving that the double-layer clad complex member can obtain quite satisfactory characteristics as was originally expected.

Further, there has been obtained a double-layer clad complex core member which is inexpensive, free from anisotropy, light-weight, and yet, with good mechanical workability.

Figure 3:
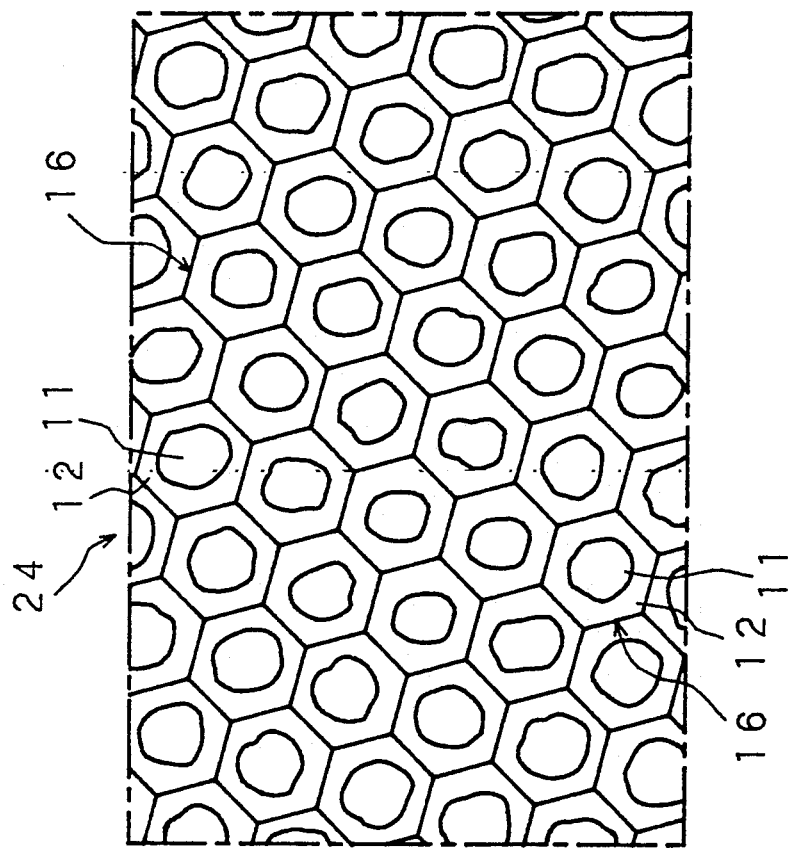
FIG. 3 illustrates a partially enlarged sectional view of the heat-radiating substrate material and a partially enlarged sectional view of the multiple-core complex material manufactured in accordance with the method embodied by the invention.

FIG. 3 illustrates a microscopic structure of the multiple-layer complex material composed of the double-layer clad complex member 16 with 1.5 mm of diameter. As shown in FIG. 3, all the core materials are firmly bonded together in substantially hexagonal formation.

Inventors further studies on the influence of the area reduction over the diffusing and bonding condition of the core materials when the hot elongation step is applied to the multiple-core complex billet 20. Inventors employ the hot extrusion process for rolling and elongating the multiple-core complex billet 20 with 1.5 mm of the outer diameter. Inventors carry out the extrusion to make the outer diameter be 30ϕ, 40ϕ, 50ϕ, and 55ϕ.

Inventors then check the presence of potential defect in the multiple-core complex material 25 by executing penetrant test, checking the bonded condition of the core materials. Results are shown in Table 4.

It is clear from the data shown in Table 4 that the manufactured core materials can satisfactorily be bonded together if not less than 20% of the area reduction is applicable.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within the meets and bounds of the claims, or equivalence of such meets and bounds thereof are therefore intended to be embraced by the claims.

TABLE 1

| element quality | Ni | Co | Fe | C | Si | Mn | Cu |
|---|---|---|---|---|---|---|---|
| 36% Ni—Fe | 36.0 | 0.10 | rest | 0.01 | 0.10 | 0.56 | — |
| Cu | — | — | — | — | — | — | 99.99 |

TABLE 4

| | extrusion schedule | area reduction | penetrant test |
|---|---|---|---|
| this invention | 67ϕ→30ϕ | 80.0% | defectless |
| | 67ϕ→40ϕ | 64.3% | defectless |
| | 67ϕ→50ϕ | 44.3% | defectless |
| | 67ϕ→55ϕ | 32.6% | defectless |
| comparison | 67ϕ→60ϕ | 19.8% | partially defective |

TABLE 2

| | outer diameter of 2-layer clad complex wire (mm) | inside diameter/core diameter (D/d) | filling number | rate of filling (%) | penetrant test | shearing strength of bonded area (kgf/mm²) | thermal expansion coefficient ($\times 10^{-6}$/°C.) | | heat transfer rate (at 25° C.) Kcal/m·h·°C. |
|---|---|---|---|---|---|---|---|---|---|
| | | | | | | | (at 100° C.) | (at 500° C.) | |
| this invention | 1.5 | 36.7 | 1100 | 81.8 | defectless | 28.2 | 5.2 | 8.7 | 120 |
| | 2.0 | 27.5 | 620 | 82.0 | defectless | 26.9 | 5.3 | 8.9 | 122 |
| | 3.0 | 18.3 | 280 | 83.3 | defectless | 27.3 | 5.4 | 9.0 | 123 |
| | 4.0 | 13.8 | 155 | 82.0 | defectless | 25.1 | 5.4 | 9.2 | 126 |
| comparison | 5.0 | 11 | 100 | 82.6 | partially defective | 17.3 | 5.4 | 10.3 | 135 |

What is claimed is:

1. A method of manufacturing multiple-core complex material comprising:
   a first step of preparing a multiple-layer clad complex core member with a circular cross section;
   a second step of densely filling a plurality of said complex core members into a metallic casing where the ratio of inner diameter (D) of said metallic casing to the outer diameter (d) of said complex core member D/d is not less than 12, and of evacuating said metallic casing to form a multiple-core complex billet;
   a third step of heating said complex billet; and
   a fourth step of diffusion bonding to bond the core members to each other by a hot working at a reduction of area being not less than 20%.

2. A method of manufacturing multiple-core complex material as set forth in claim 1, wherein said metallic tube and the external layer of said complex core member are made of the identical material.

3. A method of manufacturing multiple-core complex material as set forth in claim 1, wherein the evacuation degree in said second step is not more than $1 \times 10^{-1}$ Torr.

4. A method of manufacturing multiple-core complex material as set forth in claim 1, wherein said first step of preparing a multiple-layer clad complex core member comprises;

an assembly step of inserting a metallic rod into a metallic tube or multiple-layer metallic tubes to assemble clad material and of evacuating said metallic tube(s);

a heating step of heating said clad material;

a hot working step of elongating said heated clad material to form said multiple-layer clad complex core member; and a drawing process for drawing said clad complex core member to reduce the diameter thereof.

5. A method of manufacturing multiple-core complex material as set forth in claim 4, wherein said metallic tube is made of Ni-Fe alloy, whereas said metallic rod is composed of copper (Cu).

6. A method of manufacturing multiple-core complex material as set forth in claim 4, wherein said metallic tube is made of Ni-Co-Fe alloy, whereas said metallic rod is composed of copper (Cu).

7. A method of manufacturing multiple-core complex material as set forth in claim 4, wherein the evacuation degree in said assembly process is not more than $1 \times 10^{-1}$ Torr.

8. A method of manufacturing multiple-core complex material as set forth in claim 4, wherein said hot working step is performed with a rotary mill with a minimum of three rolls.

9. A method of manufacturing multiple-core complex material as set forth in claim 8, wherein said rotary mill is provided with cross angle $\gamma$ and feed angle $\beta$ formed between the roll axis and the rolling pass-line respectively satisfying the conditions, $0° < \gamma < 15°$,
$3° < \beta < 20°$, and
$5° < \gamma + \beta < 30°$.

10. A method of manufacturing multiple-core complex material as set forth in claim 8, wherein said rotary mill rolls at a reduction of area being not less than 50%.

11. A method of manufacturing multiple-core complex material as set forth in claim 4, wherein said hot working step comprises hot hydrostatic extrusion.

12. A method of manufacturing multiple-core complex material as set forth in claim 4, wherein said hot working process adopts a hot extrusion.

13. A method of manufacturing multiple-core complex material as set forth in claim 4, wherein said hot working step comprises a hot rolling process in which three grooved rolls are used.

14. A method of manufacturing multiple-core complex material as set forth in claim 4, wherein said hot working step comprises a hot rolling process in which four grooved rolls are used.

* * * * *